(12) United States Patent
Yim

(10) Patent No.: US 7,446,396 B2
(45) Date of Patent: Nov. 4, 2008

(54) STACKED INTEGRATED CIRCUIT LEADFRAME PACKAGE SYSTEM

(75) Inventor: Choong Bin Yim, Seongnam-si (KR)

(73) Assignee: Stats Chippac Ltd., Singapore (SG)

( * ) Notice: Subject to any disclaimer, the term of this patent is extended or adjusted under 35 U.S.C. 154(b) by 216 days.

(21) Appl. No.: 11/306,805

(22) Filed: Jan. 11, 2006

(65) Prior Publication Data

US 2007/0108604 A1 May 17, 2007

Related U.S. Application Data

(60) Provisional application No. 60/652,346, filed on Feb. 10, 2005.

(51) Int. Cl.
*H01L 23/495* (2006.01)
*H01L 21/44* (2006.01)

(52) U.S. Cl. .............. 257/666; 257/686; 257/787; 257/784; 438/123

(58) Field of Classification Search ............... 257/666, 257/686, 787, 784; 438/123
See application file for complete search history.

(56) References Cited

U.S. PATENT DOCUMENTS

| | | | | |
|---|---|---|---|---|
| 5,747,874 | A * | 5/1998 | Seki et al. ............. | 257/686 |
| 6,111,306 | A * | 8/2000 | Kawahara et al. ....... | 257/666 |
| 6,303,997 | B1 * | 10/2001 | Lee ......................... | 257/778 |
| 6,353,265 | B1 * | 3/2002 | Michii ..................... | 257/777 |
| 6,759,737 | B2 * | 7/2004 | Seo et al. ................ | 257/686 |
| 6,890,798 | B2 | 5/2005 | McMahon ................ | 438/122 |
| 6,900,530 | B1 | 5/2005 | Tsai ........................ | 257/686 |
| 6,905,913 | B2 | 6/2005 | Ohie ....................... | 438/108 |
| 6,911,723 | B2 | 6/2005 | Akram ..................... | 257/686 |
| 6,913,949 | B2 | 7/2005 | Pflughaupt et al. ...... | 438/109 |
| 2003/0001252 | A1 * | 1/2003 | Ku et al. .................. | 257/686 |

* cited by examiner

*Primary Examiner*—Nitin Parekh
(74) *Attorney, Agent, or Firm*—Mikio Ishimaru

(57) ABSTRACT

A stacked integrated circuit leadframe package system including forming a leadframe, packaging a top integrated circuit on a one side of the leadframe, packaging a bottom integrated circuit on an opposite side of the leadframe, and forming external electrical interconnects on the leadframe.

10 Claims, 5 Drawing Sheets

STACKED INTEGRATED CIRCUIT LEADFRAME PACKAGE SYSTEM

CROSS-REFERENCE TO RELATED APPLICATION(S)

This application claims the benefit of U.S. Provisional Patent Application Ser. No. 60/652,346 filed Feb. 10, 2005, and the subject matter thereof is hereby incorporated herein by reference thereto.

TECHNICAL FIELD

The present invention relates generally to integrated circuit package systems, and more particularly to a system for a stacked integrated circuit leadframe.

BACKGROUND ART

Integrated circuits are used in many portable electronic products, such as cell phone, portable computers, voice recorders, etc. as well as in many larger electronic systems, such as cars, planes, industrial control systems, etc. Across virtually all applications, there continues to be demand for reducing the size and increasing performance of the devices. The intense demand is no more visible than in portable electronics that have become so ubiquitous.

As electronic devices have become smaller and thinner, the packages for protecting and interconnecting IC chips particularly power IC have the same trend, too.

The goals in designing and manufacturing semiconductor devices have been to make the devices smaller, more complex, with higher densities, and to include additional features. One method that improves the features and the densities of the semiconductor devices is to shrink the line sizes used in the lithographic process step in fabricating semiconductor devices. For example, each one-half reduction in line width of the circuits of the semiconductor device corresponds to a four-fold increase in chip density for the same size device.

Unfortunately, increasing density simply through improved lithographic techniques is limited because of physical limits and the cost factor of scaling down the dimensions of the semiconductor device. Accordingly, many attempts to increase semiconductor device density have been pursued. One such alternative has been the stacking of multiple semiconductor devices.

Thus a need still remains for an integrated circuit package system to provide increasing density without sacrificing reliability, yield and high volume manufacturing processes. In view of the increasing demand for density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked integrated circuit leadframe package system providing forming a leadframe, packaging a top integrated circuit on a one side of the leadframe, packaging a bottom integrated circuit on an opposite side of the leadframe, and forming external electrical interconnects on the leadframe.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

Figure 1:
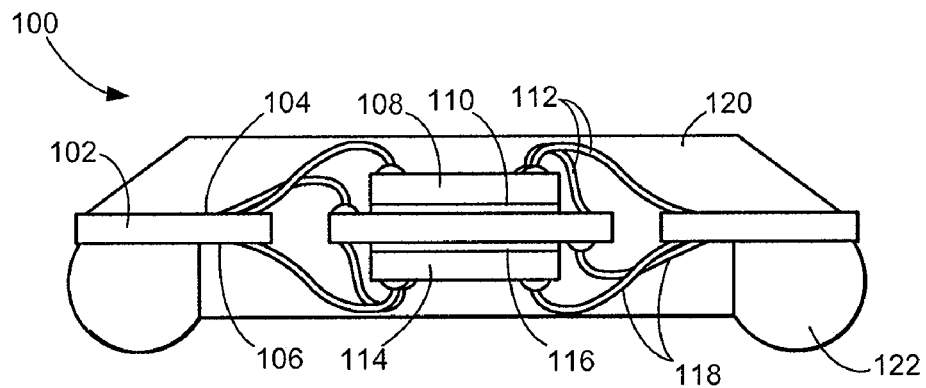
FIG. 1 is a cross-sectional view of a stacked integrated circuit leadframe package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGS. Similarly, although the sectional views in the drawings for ease of description show the invention with surfaces as oriented downward, this arrangement in the FIGS. is arbitrary and is not intended to suggest that invention should necessarily be in a downward direction. Generally, the device can be operated in any orientation. The same numbers are used in all the drawing FIGS. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of a stacked integrated circuit leadframe package system 100 in an embodiment of the present invention. The stacked integrated circuit leadframe package system 100 includes a leadframe 102 having a top surface 104 and a bottom surface 106. A top integrated circuit 108 is attached to the top surface 104 of the leadframe 102 by a top adhesive 110. The top integrated circuit 108 is electrically connected to the top surface 104 by top bondwires 112. Similarly, a bottom integrated circuit 114 is attached to the bottom surface 106 of the leadframe 102 by a bottom adhesive 116. The bottom integrated circuit 114 is electrically connected to the bottom surface 106 by bottom bondwires 118.

An encapsulant 120 covers and protects the top integrated circuit 108, the bottom integrated circuit 114, the top bondwires 112, the bottom bondwires 118 and the top surface 104. The encapsulant 120 partially covers and protects the bottom surface 106. Exposed regions of the bottom surface 106 may include a preparation, such as metal plating, for attaching electrical interconnects 122, such as solder balls. The encapsulant 120 covering the bottom integrated circuit 114 has verticals sides and the electrical interconnects 122 have vertical sides abutting the vertical sides of the encapsulant 120.

Figure 2A:
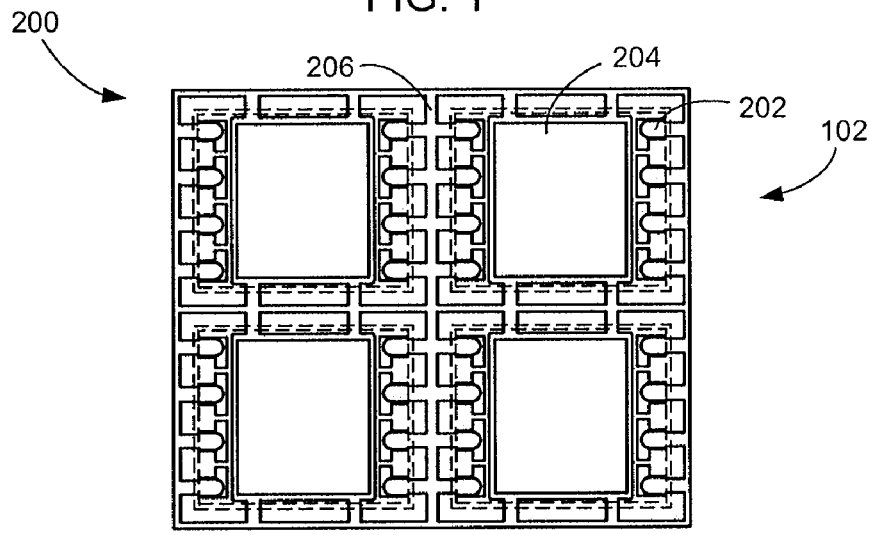
FIG. 2A is a top plan view of a leadframe array prior to singulation.

Referring now to FIG. 2A, therein is shown a top plan view of a leadframe array 200 prior to singulation. The leadframe array 200 includes electrical leads 202, a die pad 204, and a dam bar 206 for each leadframe. The dam bar 206 provides location and spacing of the electrical leads 202 of the leadframe 102 prior to encapsulation. After wire bonding and encapsulation, location and spacing of the electrical leads 202 are substantially fixed and the dam bar 206 is removed. Removing the dam bar 206 singulates the electrical leads 202 providing electrical isolation of each of the electrical leads 202. For illustrative purposes the leadframe array 200 is shown as a two by two array, although it is understood that the array may be of any quantity in either an x-dimension or a y-dimension.

Figure 2B:
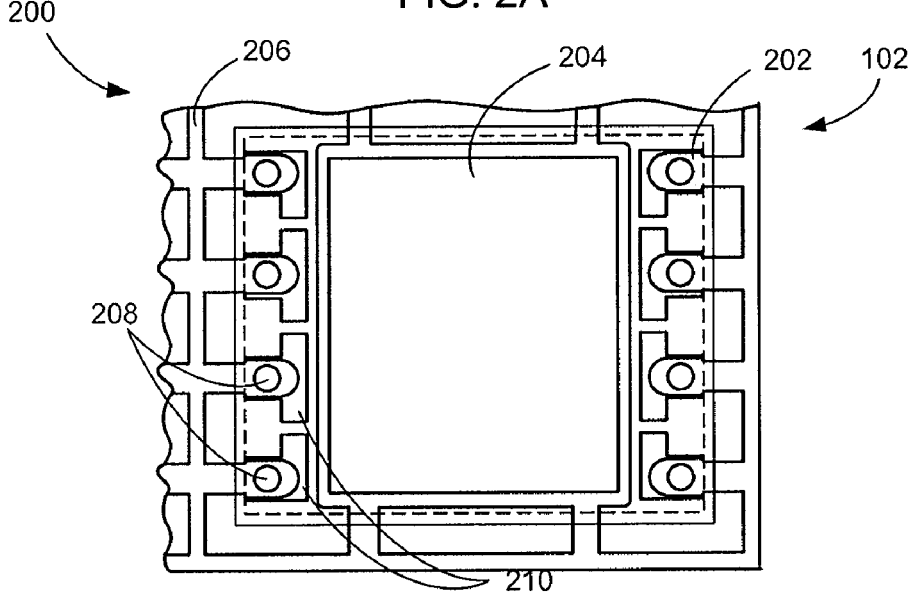
FIG. 2B is a top plan view of the leadframe array prior to singulation in greater detail.

Referring now to FIG. 2B, therein is shown a top plan view of the leadframe array 200 in greater detail. As in FIG. 2A, the leadframe array 200 includes the electrical leads 202, the die pad 204, and the dam bar 206. The leadframe array 200 further includes a first recess 208. such as a dimple, and a second recess 210.

The first recess 208 and the second recess 210 may be formed subsequent to formation of the leadframe array 200, in a removal process, such as a partial chemical etch or a half etch. The first recess 208 and the second recess 210 provide regions for conformal encapsulation to hold the electrical leads 202 and the die pad 204 in a substantially planar position with respect to one another and the top integrated circuit 108 as shown in FIG. 1 or the bottom integrated circuit 114 as shown in FIG. 1. Conformal encapsulation substantially prevents vertical movement in the electrical leads 202 and the die pad 204.

Figure 3:
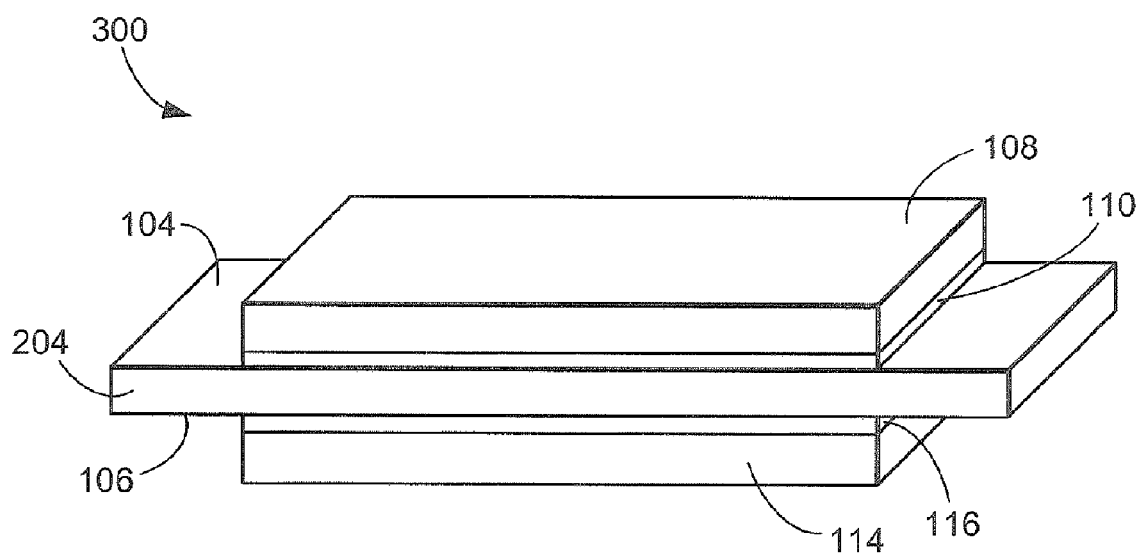
FIG. 3 is an isometric view of the stacked integrated circuit leadframe package system of FIG. 1 without the electrical leads of FIG. 2A in a die attach phase.

Referring now to FIG. 3, therein is shown an isometric view 300 of the stacked integrated circuit leadframe package system 100 of FIG. 1 without the electrical leads 202 of FIG. 2A in a die attach phase. The die pad 204 of FIG. 2A includes a part of the top surface 104 of FIG. 1 and a part of the bottom surface 106 of FIG. 1. The top surface 104 of the die pad 204 and the bottom surface 106 of the die pad 204 provide mounting surfaces for the top integrated circuit 108 and the bottom integrated circuit 114, respectively. The top adhesive 110 attaches the top integrated circuit 108 to the top surface 104. In a similar manner, the bottom adhesive 116 attaches the bottom integrated circuit 114 to the bottom surface 106.

Figure 4:
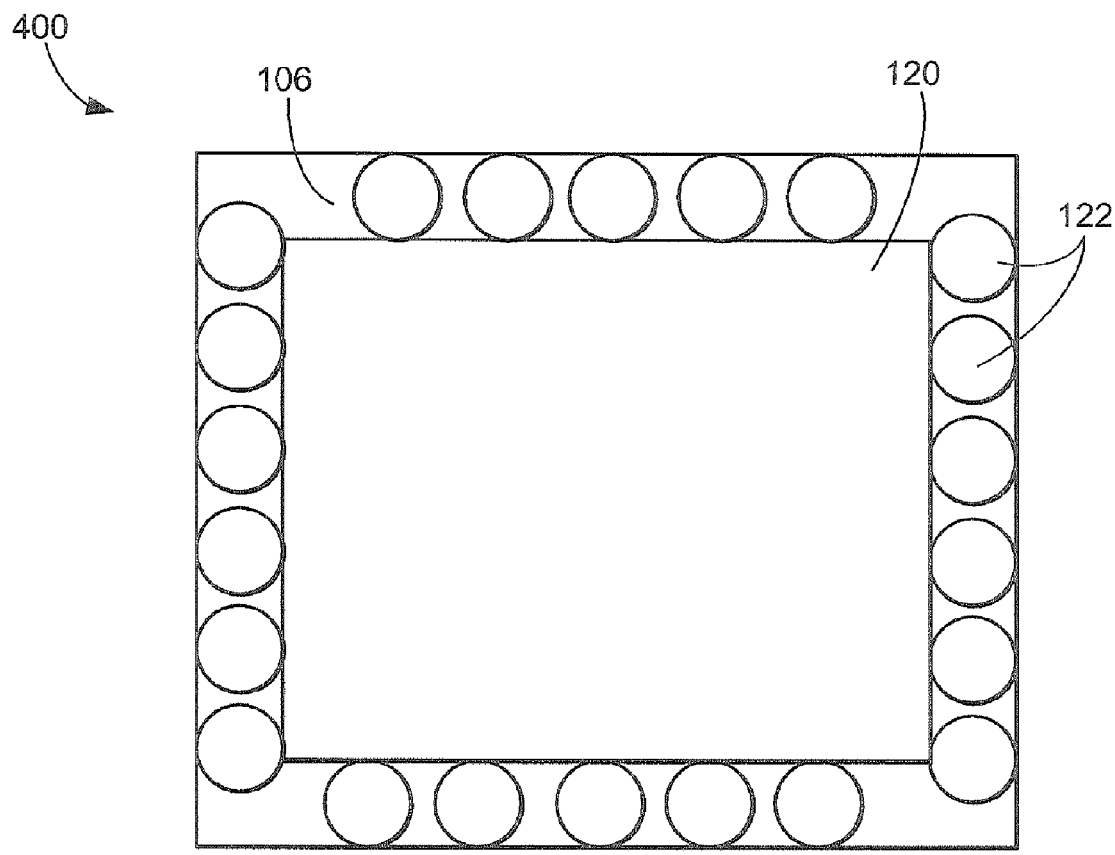
FIG. 4 is a bottom plan view of the stacked integrated circuit leadframe package system.

Referring now to FIG. 4, therein is shown a bottom plan view 400 of the stacked integrated circuit leadframe package system 100. The stacked integrated circuit leadframe package system 100 includes the electrical interconnects 122 of FIG. 1 and the encapsulant 120 of FIG. 1 over the bottom integrated circuit 114 of FIG. 1 (not shown). The electrical interconnect 122 are deposited on the bottom surface 106 of FIG. 1 of the leadframe 102 of FIG. 1, and adjacent to the encapsulant 120 over the bottom integrated circuit 114. The electrical interconnects 122 provide electrical connectivity to the next level in a system, such as a printed circuit board, chip carrier or another integrated circuit package.

Figure 5:
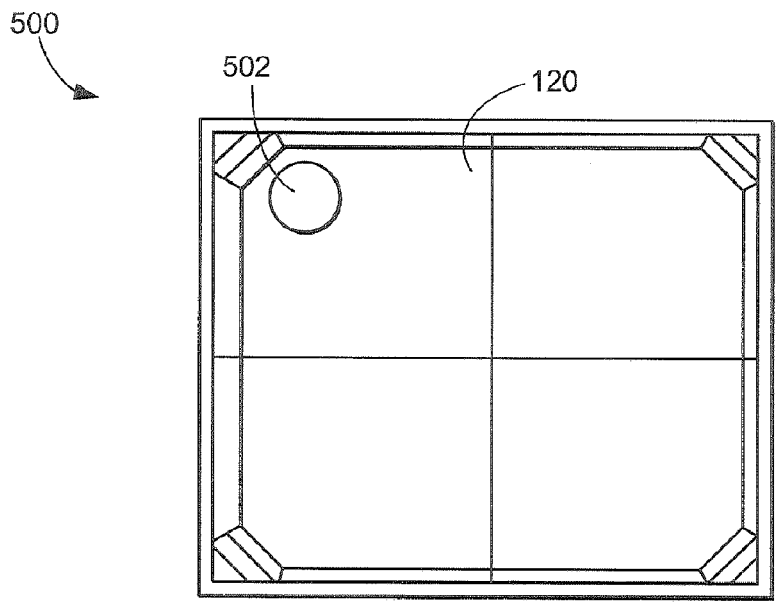
FIG. 5 is a top view the stacked integrated circuit leadframe package system.

Referring now to FIG. 5, therein is shown a top view of the stacked integrated circuit leadframe package system 100. The top of the stacked integrated circuit leadframe package system 100 includes the encapsulant 120 of FIG. 1 and an orientation mark 502. The encapsulant 120 covers the top integrated circuit 108 (not shown), the top bondwires 112 (not shown) and the top surface 104 (not shown) of the leadframe 102 (not shown). The top integrated circuit 108, the top bondwires 112 and the top surface 104 of the leadframe 102, are substantially enclosed by the encapsulant 120. The orientation mark is formed, such as by molding, applying an adhesive or etching, to provide a reference point with respect to a horizontal or rotational position of the stacked integrated circuit leadframe package system 100.

Figure 6:
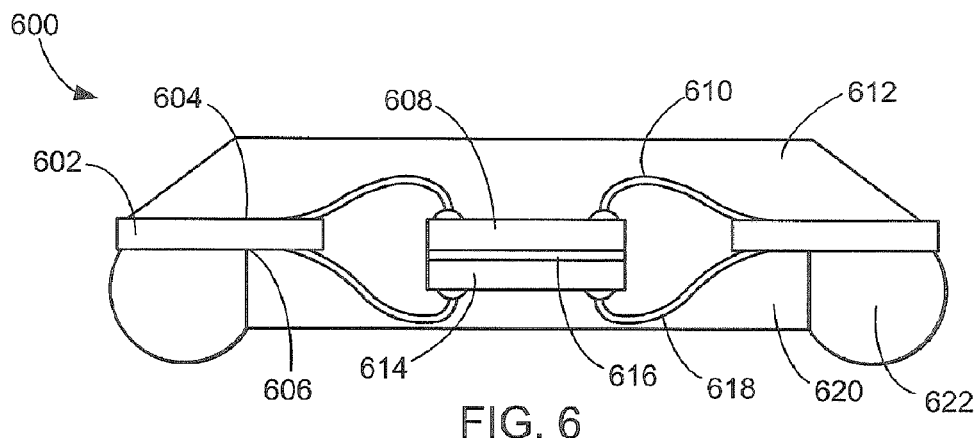
FIG. 6 is a cross-sectional view of a stacked integrated circuit leadframe package system 600 in an alternative embodiment of the present invention.

Referring now to FIG. 6, therein is shown a cross-sectional view of a stacked integrated circuit leadframe package system 600 in an alternative embodiment of the present invention. The stacked integrated circuit leadframe package system 600 includes a leadframe 602 having a top surface 604 and a bottom surface 606. An adhesive layer (not shown), such as a coverlay tape, is attached to the bottom surface 606 of the leadframe 602 providing a planar surface across the leadframe 602. A top integrated circuit 608 is attached to the adhesive layer in a plane of the bottom surface 606. The top integrated circuit 608 is electrically connected to the top surface 604 of the leadframe 602 by top bondwires 610. A top encapsulant 612 covers and protects the leadframe 602, the top integrated circuit 608 and the top bondwires 610.

After a curing process of the top encapsulant 612, the adhesive layer is removed exposing the bottom surface 606 and the top integrated circuit 608. A bottom integrated circuit 614 is attached to the top integrated circuit 608 by an adhesive 616. The bottom integrated circuit 614 is electrically connected to the bottom surface 606 by bottom bondwires 618. A bottom encapsulant 620 covers and protects the bottom integrated circuit 614 and the bottom bondwires 618. The bottom encapsulant 620 partially covers and protects the bottom surface 606. Exposed regions of the bottom surface 606 may include a preparation, such as metal plating, for attaching electrical interconnects 622, such as solder balls. The electrical interconnects 622 are attached to the bottom surface 606 to provide electrical connectivity to the next level in a system, such as a printed circuit board, chip carrier or another integrated circuit package.

Figure 7:
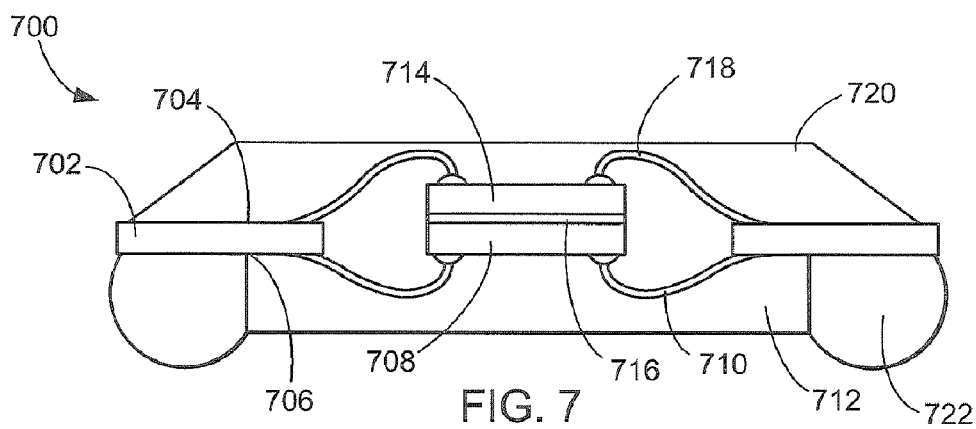
FIG. 7 is a cross-sectional view of a stacked integrated circuit leadframe package system in another alternative embodiment of the present invention.

Referring now to FIG. 7, therein is shown a cross-sectional view of a stacked integrated circuit leadframe package system 700 in another alternative embodiment of the present invention. The stacked integrated circuit leadframe package system 700 includes a leadframe 702 having a top surface 704 and a bottom surface 706. An adhesive layer (not shown), such as a coverlay tape, is attached to the top surface 704 of the leadframe 702 providing a planar surface across the leadframe 702. A bottom integrated circuit 708 is attached to the adhesive layer in a plane of the top surface 704. The bottom integrated circuit 708 is electrically connected to the bottom surface 706 of the leadframe 702 by bottom bondwires 710. A bottom encapsulant 712 covers and protects the bottom integrated circuit 708 and the bottom bondwires 710. The bottom encapsulant 712 partially covers and protects the bottom surface 706.

After a curing process of the bottom encapsulant 712, the adhesive layer is removed exposing the top surface 704 and the bottom integrated circuit 708. A top integrated circuit 714 is attached to the bottom integrated circuit 708 by an adhesive 716. The top integrated circuit 714 is electrically connected to the top surface 704 by top bondwires 718. A top encapsulant 720 covers and protects the leadframe 702, the top integrated circuit 714 and the top bondwires 718. Exposed regions of the bottom surface 706 may include a preparation, such as metal plating, for attaching electrical interconnects 722, such as solder balls. The electrical interconnects 722 are attached to the bottom surface 706 to provide electrical connectivity to the next level in a system, such as a printed circuit board, chip carrier or another integrated circuit package.

Figure 8:
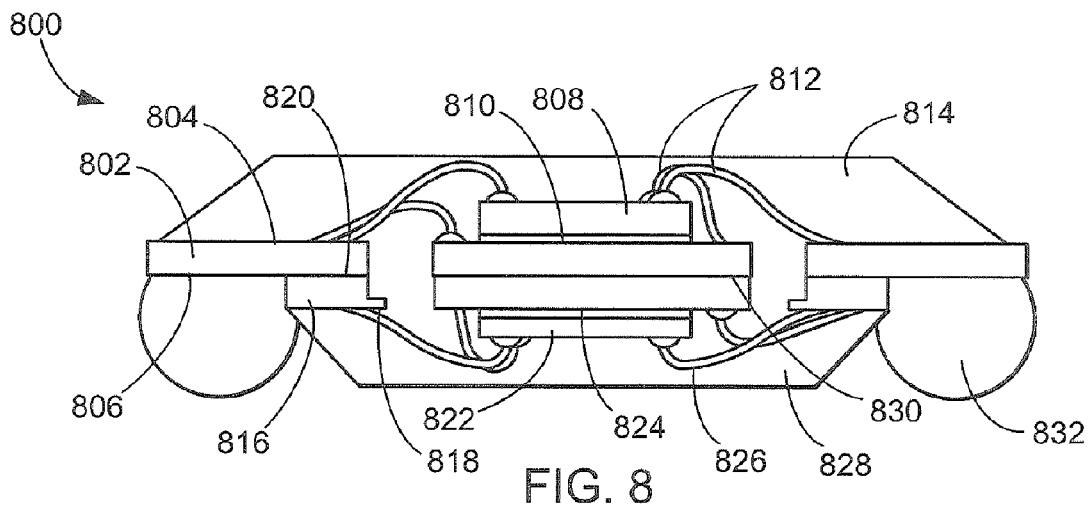
FIG. 8 is a cross-sectional view of a stacked integrated circuit leadframe package system in yet another alternative embodiment of the present invention.

Referring now to FIG. 8, therein is shown a cross-sectional view of a stacked integrated circuit leadframe package system 800 in yet another alternative embodiment of the present invention. Similar to the stacked integrated circuit leadframe package system 100 as shown in FIG. 1, the stacked integrated circuit leadframe package system 800 includes a leadframe 802 having a top surface 804 and a bottom surface 806. A top integrated circuit 808 is attached to the top surface 804 of the leadframe 802 by a top adhesive 810. The top integrated circuit 808 is electrically connected to the top surface 804 by top bondwires 812. A top encapsulant 814 covers and protects the leadframe 802, the top integrated circuit 808 and the top bondwires 812.

The stacked integrated circuit leadframe package system 800 also includes a second leadframe 816 having a top surface 818 and a bottom surface 820. A second integrated circuit 822 is attached to the top surface 818 of the second leadframe 816 by a second adhesive 824. The second integrated circuit 822 is electrically connected to the top surface 818 by second bondwires 826. A second encapsulant 828 covers and protects the second leadframe 816, the second integrated circuit 822 and the second bondwires 826.

Planar dimensions of the second leadframe 816 are predetermined to be smaller than planar dimensions of the leadframe 802 less the planar dimensions of electrical interconnects 832. Exposed regions of the bottom surface 806 of the leadframe 802 may include a preparation, such as metal plating, for attaching the electrical interconnects 832, such as solder balls. The electrical interconnects 832 are attached to the bottom surface 806 of the leadframe 802 to provide electrical connectivity to the next level in a system, such as a printed circuit board, chip carrier or another integrated circuit package.

An example of the above would be a combined large leadframe chip scale package (LFCSP) for the top and a small LFCSP for the bottom.

Figure 9:
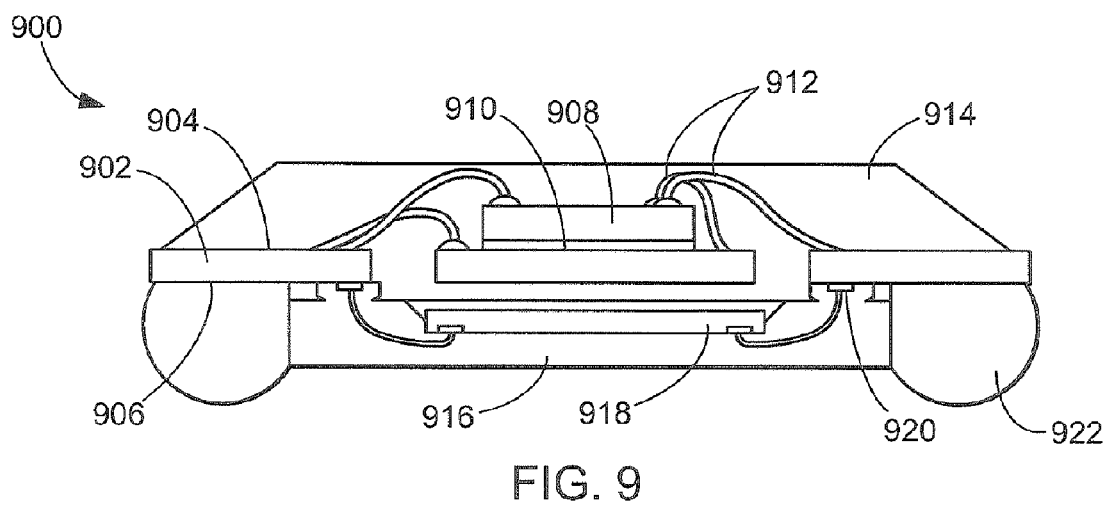
FIG. 9 is a cross-sectional view of a stacked integrated circuit leadframe package system in yet another alternative embodiment of the present invention.

Referring now to FIG. 9, therein is shown a cross-sectional view of a stacked integrated circuit leadframe package system 900 in yet another alternative embodiment of the present invention. Similar to the stacked integrated circuit leadframe package system 100 as shown in FIG. 1, the stacked integrated circuit leadframe package system 900 includes a leadframe 902 having a top surface 904 and a bottom surface 906. A top integrated circuit 908 is attached to the top surface 904 of the leadframe 902 by a top adhesive 910. The top integrated circuit 908 is electrically connected to the top surface 904 by top bondwires 912. A top encapsulant 914 covers and protects the leadframe 902, the top integrated circuit 908 and the top bondwires 912.

A bump chip carrier (BCC) 916 having a second integrated circuit 918 is attached to the leadframe 902. Chip carrier bumps 920 and the leadframe 902 are attached both mechanically and electrically with a bonding material, such as plating metal. Planar dimensions of the bump chip carrier 916 are predetermined to be smaller than planar dimensions of the leadframe 902 less the planar dimensions of electrical interconnects 922. Exposed regions of the bottom surface 906 of the leadframe 902 may include a preparation, such as metal plating, for attaching the electrical interconnects 922, such as solder balls. The electrical interconnects 922 are attached to the bottom surface 906 of the leadframe 902 to provide electrical connectivity to the next level in a system, such as a printed circuit board, chip carrier or another integrated circuit package.

An example of the above would be a large LFCSP for the top and a small BCC for the bottom.

Figure 10:
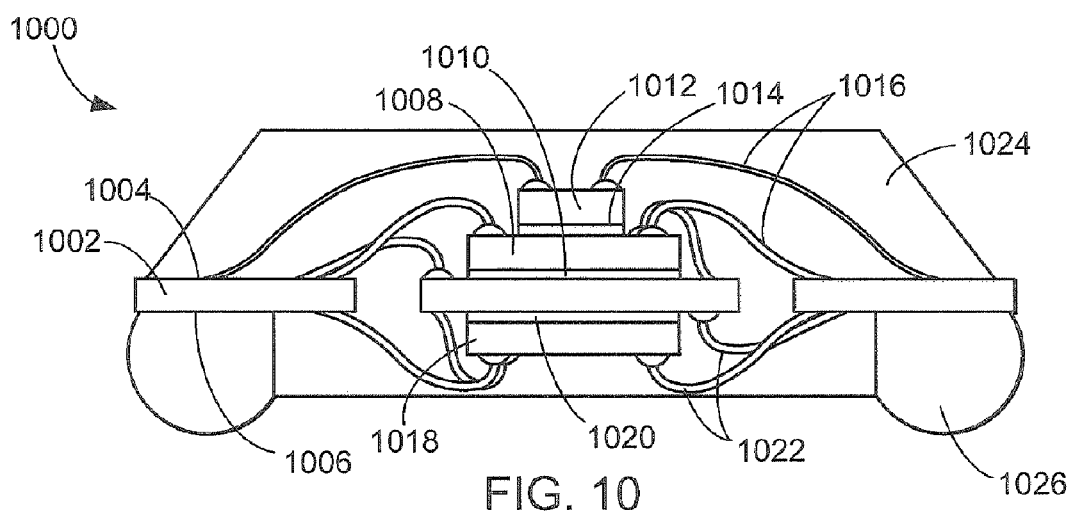
FIG. 10 is a cross-sectional view of a stacked integrated circuit leadframe package system in yet another alternative embodiment of the present invention.

Referring now to FIG. 10, therein is shown a cross-sectional view of a stacked integrated circuit leadframe package system 1000 in yet another alternative embodiment of the present invention. Similar to the stacked integrated circuit leadframe package system 100 as shown in FIG. 1, the stacked integrated circuit leadframe package system 1000 includes a leadframe 1002 having a top surface 1004 and a bottom surface 1006. A top integrated circuit 1008 is attached to the top surface 904 of the leadframe 902 by a top adhesive 1010.

In contrast to the stacked integrated circuit leadframe package system 100 as shown in FIG. 1, a stacked-die integrated circuit 1012 is attached to the top integrated circuit 1008 by a second top adhesive 1014. The top integrated circuit 1008 and the stacked-die integrated circuit 1012 are electrically connected to the top surface 1004 by top bondwires 1016. Planar dimensions of the stacked-die integrated circuit 1012 are predetermined to be smaller than planar dimensions of the top integrated circuit 1008 less the planar dimensions of connection regions, such as bond pads, for the top bondwires 1016.

Also similar to the stacked integrated circuit leadframe package system 100 as shown in FIG. 1, a bottom integrated circuit 1018 is attached to the bottom surface 1006 of the leadframe 1002 by a bottom adhesive 1020. The bottom integrated circuit 1018 is electrically connected to the bottom surface 1006 by bottom bondwires 1022. An encapsulant 1024 covers and protects the top integrated circuit 1008, the stacked-die integrated circuit 1012, the bottom integrated circuit 1018, the top bondwires 1016, the bottom bondwires 1022 and the top surface 1004.

Alternatively, an integrated circuit in a land grid array (not shown) may be used in place of the bottom integrated circuit 1018. The integrated circuit in a land grid array may be connected to the bottom surface 1006 by bottom bondwires 1022, as well. The encapsulant 1024 would be applied as above to cover and protect the integrated circuit in a land grid array.

Again similar to the stacked integrated circuit leadframe package system 100 as shown in FIG. 1, the encapsulant 1024 partially covers and protects the bottom surface 1006. Exposed regions of the bottom surface 1006 may include a preparation, such as metal plating, for attaching electrical interconnects 1026, such as solder balls. The electrical interconnects 1026 are attached to the bottom surface 1006 to provide electrical connectivity to the next level in a system, such as a printed circuit board, chip carrier or another integrated circuit package.

An example of the above would be a LFCSP for the top and a small LFCSP or land grid array (LGA) package for the bottom.

Figure 11:
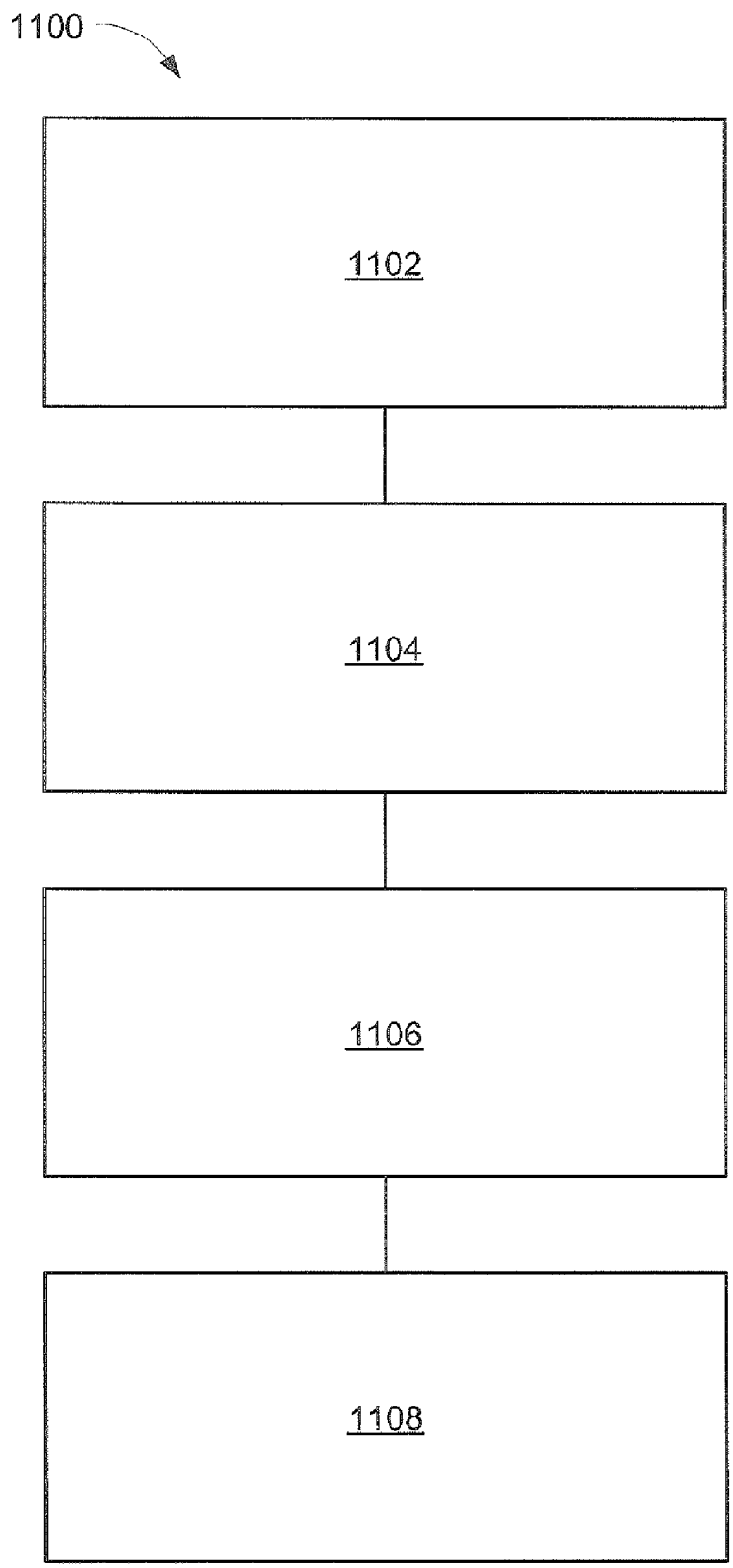
FIG. 11 is a flow chart of a system of a system for a stacked integrated circuit leadframe package in an embodiment of the present invention.

Referring now to FIG. 11, therein is shown a flow chart of a system 1100 for a stacked integrated circuit leadframe package in an embodiment of the present invention. The system 1100 includes forming a leadframe in a block 1102; packaging a top integrated circuit on a one side of the leadframe in a block 1104; packaging a bottom integrated circuit on an opposite side of the leadframe in a block 1106; and forming an external electrical interconnects on the leadframe in a block 1108.

In greater detail, a method to fabricate the stacked integrated circuit leadframe package system 100, in an embodiment of the present invention, is performed as follows:

(1) 1. Forming a leadframe. (FIG. 1)
(2) 2. Mounting a top integrated circuit on a one side of the leadframe. (FIG. 1)
(3) 3. Connecting the top integrated circuit to the one side of the leadframe. (FIG. 1)
(4) 4. Encapsulating the top integrated circuit with the one side of the leadframe. (FIG. 1)
(5) 5. Mounting a bottom integrated circuit on an opposite side of the leadframe. (FIG. 1)
(6) 6. Connecting the bottom integrated circuit to the opposite side of the leadframe. (FIG. 1)
(7) 7. Encapsulating the bottom integrated circuit with the opposite side of the leadframe. (FIG. 1)
(8) 8. Depositing external electrical interconnects on the leadframe. (FIG. 1)

It has been discovered that the present invention thus has numerous advantages.

An advantage is that the present invention reduces the size of multiple integrated circuit packages. The stacking of integrated circuits is more compact and space efficient, particularly with respect to the footprint or planar dimension. The elimination of additional packages, even chip-scale, provides significant size reductions.

It has been discovered that the disclosed structure provides higher operating speeds. The size reduction also provides shorter interconnections between integrated circuits and the next level system or product, such as a printed circuit board, chip carrier or another integrated circuit package. The shorter interconnections reduce parasitics and improve speed.

It has also been discovered that the disclosed structure provides improved electrical performance between the integrated circuits. Minimizing the distance between multiple integrated circuits provides significant improvements in electrical signals between the integrated circuits.

Yet another discovery of the disclosed structure is improvements in the system or product. The compactness and space efficiency contribute to area and volume improvements, and improved operating speeds and electrical performance contribute to power and heat savings of the product.

Yet another discovery of the disclosed structure is compatibility to integrated circuit die with both center pads and peripheral pads. Integrated circuits stacked on multiple surfaces and with multiple orientations, provide flexibility to accommodate multiple integrated circuit input/output pad locations.

Yet another discovery of the disclosed structure is compatibility with several package types, such as leadframe, bump chip carrier and land grid array. The stacking on multiple surfaces and multiple orientations of active and non-active surfaces accommodates a variety of package types.

Yet another discovery of the disclosed structure is improved connectivity between the protruding solder ball and the printed circuit board. The solder interconnect provides improved manufacturing, such as cost, complexity, volume, yield and compatibility, over other interconnect technologies, such as land grid arrays.

Yet another discovery of the disclosed structure is improvements in manufacturing yields and processes. The multiple integrated circuits may be tested individually during intermediate phases of the processing. This prevents costly scrap of good integrated circuits after combining failed integrated circuits.

These and other valuable aspects of the present invention consequently further the state of the technology to at least the next level.

Thus, it has been discovered that the stacked integrated circuit leadframe system method and apparatus of the present invention furnish important and heretofore unknown and unavailable solutions, capabilities, and functional advantages. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A stacked integrated circuit leadframe package system comprising:
   forming a flat leadframe;
   packaging a top integrated circuit on a one side of the leadframe;
   packaging a bottom integrated circuit on an opposite side of the leadframe;
   encapsulating the bottom integrated circuit with an encapsulant having vertical sides; and
   forming solder balls on the leadframe, the solder balls having vertical sides abutting the vertical sides of the encapsulant.

2. The system as claimed in claim 1 wherein forming the leadframe further comprises forming a leadframe array having multiple leadframes.

3. The system as claimed in claim 1 wherein packaging the top integrated circuit further comprises mounting a further integrated circuit on the top integrated circuit.

4. The system as claimed in claim 1 wherein:
   packaging the top integrated circuit or packaging the bottom integrated circuit further comprises applying an adhesive tape between the top integrated circuit or the bottom integrated circuit and the leadframe;
   removing the adhesive tape, and
   bonding the bottom integrated circuit and the top integrated circuit.

5. The system as claimed in claim 1 wherein packaging the bottom integrated circuit further comprises attaching a chip scale package to the leadframe.

6. A stacked integrated circuit leadframe package system comprising:

forming a flat leadframe;
mounting a top integrated circuit on a one side of the leadframe;
electrically connecting the top integrated circuit to the one side of the leadframe;
encapsulating the top integrated circuit with the one side of the leadframe;
mounting a bottom integrated circuit on an opposite side of the leadframe;
electrically connecting the bottom integrated circuit to the opposite side of the leadframe;
encapsulating the bottom integrated circuit with the opposite side of the leadframe with an encapsulant having vertical sides; and
depositing solder balls on the leadframe, the solder balls having vertical sides abutting the vertical sides of the encapsulant.

7. The system as claimed in claim 6 wherein packaging the top or bottom integrated circuit further comprises:
  mounting a further integrated circuit on the top integrated circuit; and
  electrically connect the further integrated circuit to the one side of the leadframe.

8. The system as claimed in claim 6 wherein:
  packaging the top integrated circuit or packaging the bottom integrated circuit further comprises applying an adhesive tape between the top integrated circuit or the bottom integrated circuit and the leadframe;
  removing the adhesive tape;
  bonding the bottom integrated circuit and the top integrated circuit.

9. The system as claimed in claim 6 wherein mounting the bottom integrated circuit further comprises:
  mounting the bottom integrated circuit in a chip scale package; and
  mounting the chip scale package on the opposite side of the leadframe.

10. The system as claimed in claim 6 wherein forming the leadframe further comprises:
  forming a further leadframe attached to the opposite side of the leadframe with the bottom integrated circuit attached thereto.

* * * * *